(12) United States Patent
Kintis et al.

(10) Patent No.: US 7,276,981 B2
(45) Date of Patent: Oct. 2, 2007

(54) 3D MMIC VCO AND METHODS OF MAKING THE SAME

(75) Inventors: Mark Kintis, Manhattan Beach, CA (US); Flavia S. Fong, Monterey Park, CA (US); Thomas T. Y. Wong, Skokie, IL (US); Xing Lan, La Palma, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 177 days.

(21) Appl. No.: 11/236,033

(22) Filed: Sep. 27, 2005

(65) Prior Publication Data

US 2007/0069824 A1 Mar. 29, 2007

(51) Int. Cl.
*H03B 5/00* (2006.01)

(52) U.S. Cl. .......................................... 331/56; 331/96

(58) Field of Classification Search .................. 331/46, 331/56, 74, 96, 107 DP, 107 P, 107 SL, 108 C, 331/117 D
See application file for complete search history.

(56) References Cited

U.S. PATENT DOCUMENTS

| 4,567,449 A | * | 1/1986 | Bert et al. ..................... 331/56 |
|---|---|---|---|
| 5,231,361 A | | 7/1993 | Smith et al. |
| 6,362,706 B1 | | 3/2002 | Song et al. |
| 6,411,182 B1 | | 6/2002 | Song et al. |
| 2005/0156675 A1 | | 7/2005 | Rohde et al. |

* cited by examiner

*Primary Examiner*—David Mis
(74) *Attorney, Agent, or Firm*—Tarolli, Sundheim, Covell & Tummino LLP

(57) ABSTRACT

A three dimensional (3D) microwave monolithic integrated circuit (MMIC) multi-push voltage controlled oscillator (VCO) and methods of making the same is provided. The 3D MMIC multi-push oscillator includes a plurality of matching frequency oscillators coupled to a phasing ring in substantially equidistantly spaced apart locations. A combined VCO output signal is provided at a central output connection point of the phasing ring. The central output connection point resides on a first plane. An output conductor transition has a first end coupled to the central output connection point and a second end provided as an output to the quad-push VCO. The output conductor transition extends transverse to the first plane and terminates at a second plane separated from the first plane. The multi-push oscillator can be a push-push, quad-push or N-push type VCO based on a particular implementation.

23 Claims, 4 Drawing Sheets

3D MMIC VCO AND METHODS OF MAKING THE SAME

TECHNICAL FIELD

The present invention relates generally to electronics, and more particularly to a three dimensional (3D) microwave monolithic integrated circuit (MMIC) voltage controlled oscillator (VCO) and methods of making the same.

BACKGROUND

A voltage controlled oscillator (VCO) or oscillator is a component that can be used to translate DC power into a radio frequency (RF) signal. In general, VCOs are designed to produce an oscillating signal of a particular frequency corresponding to a given tuning voltage. The frequency of the oscillating signal is dependent upon the magnitude of a tuning voltage. A high frequency signal can be generated either by an oscillator operating at a fundamental frequency or a harmonic oscillator. An oscillator operating at the fundamental frequency typically suffers from a low Q-factor, insufficient device gain and higher phase noise at a high frequency of operation. In contrast, harmonic oscillators may be operated at a lower frequency, and generally include a high Q-factor, high device gain and low phase noise. A frequency doubler and other means of up-conversion may provide a practical and quick solution to generate a high frequency signal from an oscillator operating at a lower frequency, however, they may also introduce distortions and provide poor phase noise performance.

It is very difficult to design a high frequency signal source with good phase noise for millimeter wave applications. Conventional implementations employ multipliers and buffer/power amplifiers to multiply the fundamental frequency of a voltage controlled oscillator (VCO) to millimeter wave bands (e.g., greater than 50 GHz). These conventional implementations have several problems. For example, the employment of the several multipliers and buffer/power amplifiers add to the complexity of the topology in addition to adding to the phase noise degradation. Additionally, the performance of the high frequency source signal is parasitic sensitive, such that the parasitics of each buffer/amplifier stage further degrade the performance of the high frequency source signal. The employment of several multipliers and buffer/power amplifiers results in high power consumption, tedious and challenging tuning work associated with one or more tuning resonators in addition to high overall costs.

SUMMARY

In one aspect of the invention, a three dimensional (3D) microwave monolithic integrated circuit (MMIC) multi-push voltage controlled oscillator (VCO) is provided. The multi-push VCO comprises a phasing ring having a plurality of substantially equidistantly spaced apart VCO connection points and a central output connection point. The central output connection point resides in a first plane. The multi-push VCO further comprises a plurality of VCOs with each of the plurality of VCOs being coupled to one associated VCO connection point. The multi-push VCO also comprises an output conductor transition that extends from the central output connection point and terminates at an output tap located in a second plane that is spaced apart from the first plane.

In another aspect of the invention, a 3D MMIC quad-push VCO is provided. The quad-push VCO comprises a phasing ring having four substantially equidistantly spaced apart VCO connection points and a central output connection point. The central output connection point resides in a first layer. The quad-push VCO further comprises four frequency matching VCOs with each of the four frequency matching VCOs being coupled to one associated VCO connection point. The quad-push VCO also comprises an output conductor transition that extends from the central output connection point and terminates at an output tap located in a second layer that is spaced apart from the first layer.

In yet another aspect of the invention, a method of forming a 3D MMIC multi-push VCO is provided. The method comprises forming in a first layer a phasing ring having a plurality of substantially equidistantly spaced apart VCO connection points and a central connection output point and a plurality of frequency matched VCOs each with outputs coupled to one associated VCO connection point and forming an output conductor transition having a first end coupled to the central output connection point. The output conductor transition extends transverse from the first layer. The method further comprises forming an output tap at the second layer. The output tap is coupled to a second end of the output conductor transition.

DETAILED DESCRIPTION

The present invention relates to a three dimensional (3D) microwave monolithic integrated circuit (MMIC) multi-push voltage controlled oscillator (VCO) (i.e., N-push/push-push oscillator topology as an Nth harmonic oscillator, where N is an integer ≧2). The 3D MMIC multi-push VCO includes a plurality of matching frequency oscillators coupled to a phasing ring in substantially equidistantly spaced apart locations. A combined VCO output signal is provided at a central output connection point of the phasing ring. The central output connection point resides on a first plane. A vertical output conductor transition has a first end coupled to the central output connection point and a second end provided as an output to the multi-push VCO that extends transverse to the first plane and terminates at a second plane separated from the first plane. The multi-push oscillator can be a push-push, quad-push or N-push type VCO based on a particular implementation.

Each VCO is designed to operate at a fundamental frequency, which is 1/N of the final output frequency. The 3D multi-push VCO provides for reduced phase noise by eliminating multipliers, reduced power consumption from eliminating the need of using amplifiers to make up the high loss of multipliers, while also eliminating tuning. Therefore, there is a significant reduction for the amount of MMIC chips used, tight circuit tolerance control to improve yield, and overall higher performance and lower cost. The present examples will be illustrated with respect to a quad-push VCO. However, it is to be appreciated that the present invention can be employed in other N-type multi-push VCOs.

Figure 1:
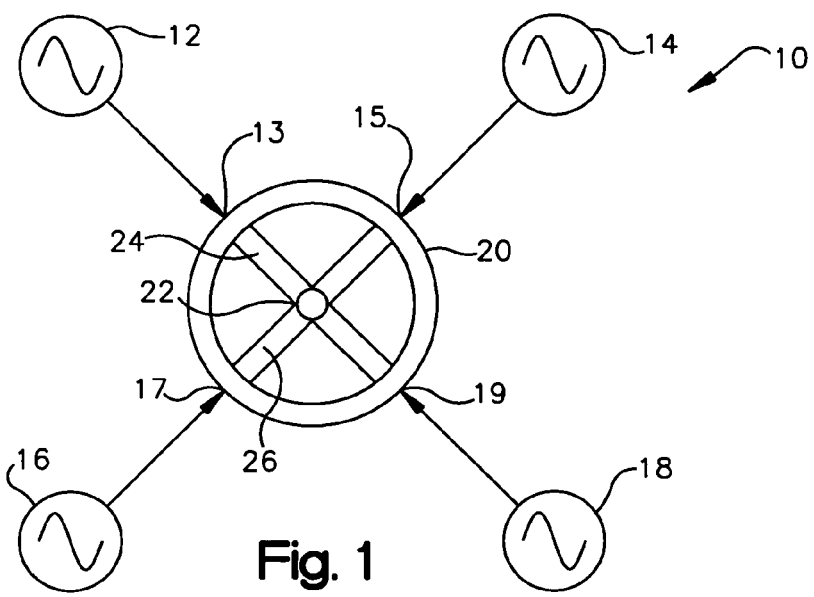
FIG. 1 illustrates a plan view of a three dimensional (3D) microwave monolithic integrated circuit (MMIC) quad-push voltage controlled oscillator (VCO) in accordance with an aspect of the present invention

FIG. 1 illustrates a plan view of a 3D MMIC quad-push VCO 10 in accordance with an aspect of the present invention. The quad-push VCO 10 includes a plurality of oscillators coupled to a phasing ring 20 at respective VCO connection points. The circular-shape phasing ring provides for size reduction as opposed to employing lumped elements. Each VCO can be formed from a respective resonator and a respective core. The plurality of oscillators are selected to have substantially matching frequencies and processing characteristics, such that each of the plurality of oscillators operate in substantially the same manner at substantially the same operating frequency. The phasing ring 20 has a circumference that is substantially equal to one waveguide wavelength at the fundamental frequency (or ¼ of the final output frequency).

A first VCO 12 is coupled to a first VCO connection point 13, a second VCO 14 is coupled to a second VCO connection point 15, a third VCO 16 is coupled to a third VCO connection point 17, while a fourth VCO 18 is coupled to a fourth VCO connection point 19. The first VCO connection point 13 is connected to the third VCO connection point 19 via a first crossbar 24 and the second VCO connection point 15 is connected to the fourth VCO connection point 17 via a second crossbar 26. The first and second crossbars 24 and 26 overlap at a central output connection point 22 forming an "X" pattern in the circumference of the phasing ring 20, such that an output signal that is a combination of the plurality of VCOs 12, 14, 16 and 18 is provided at the central output connection point 22.

The dimensions of the phasing ring are selected such that the connection points are separated by a distance of ¼ waveguide wavelength from adjacent VCO connection points, such that the respective input signal from each VCO is provided at 90° out of phase with a respective adjacent input signal. Therefore, the four VCOs are operating in mutual injection mode oscillating at the same fundamental frequency with a phase difference of 90°, 180° and 270° from each other. This provides an output signal that includes $4^{th}$ harmonic multiples, while canceling out the fundamental frequencies, the $1^{st}$, $2^{nd}$ and $3^{rd}$ harmonic multiples.

The following equations illustrate the first VCO input signal (V1), the second VCO input signal (V2), the third VCO input signal (V3) and the fourth inputs signal (V4):

$$V_1 = V\angle\omega_0 t + K_1 V\angle 2\omega_0 t + K_2 V\angle 3\omega_0 t + K_3 V\angle 4\omega_0 t + \quad \text{EQ. 1}$$

$$V_2 = V\angle(\omega_0 t - 90°) + K_1 V\angle 2(\omega_0 t - 90°) + K_2 V\angle 3(\omega_0 t - 90°) + K_3 V\angle 4(\omega_0 t - 90°) + \quad \text{EQ. 2}$$

$$V_3 = V\angle(\omega_0 t - 180°) + K_1 V\angle 2(\omega_0 t - 180°) + K_2 V\angle 3(\omega_0 t - 180°) + K_3 V\angle 4(\omega_0 t - 180°) + \quad \text{EQ. 3}$$

$$V_4 = V\angle(\omega_0 t - 270°) + K_1 V\angle 2(\omega_0 t - 270°) + K_2 V\angle 3(\omega_0 t - 270°) + K_3 V\angle 4(\omega_0 t - 270°) + \quad \text{EQ. 4}$$

As shown above, the fundamental frequencies and the associated harmonics of each oscillator are provided with a phase difference of 90°, 180° and 270° from each other. Therefore, the fundamental frequencies and associated harmonics cancel out except for harmonics with multiples of four providing the following combined output signal illustrated in EQ. 5:

$$V\text{out} = a\angle 4\omega_0 t + b\omega 8\omega_0 t + \ldots \quad \text{EQ. 5}$$

The plurality of VCOs 12, 14, 16 and 18 and the phasing ring 20 are formed on a first plane employing a MMIC conductive material (e.g., gold). A transverse or vertical output conductor transition has a first end coupled to the central output connection point 22 and a second end provided as an output to the quad-push VCO 10 that extends substantially perpendicular or transverse to the first plane and ends at a second plane separating the quad-push VCO 10 from its output by a gap.

In this manner, an escape is provided for the output of the quad-push VCO 10 to an adjacent layer mitigating crossover of the quad-push VCO output through the phasing ring 20, thus preventing phase misalignment. The vertical or transverse output conductor used for center tapping the output signal from the phasing ring 20 avoids destroying performance sensitive ring symmetry. In one aspect of the invention, the gap can be formed by employing wafer level packaging (WLP), such that the first and second planes are formed on first and second wafers that are stacked separated by bonding posts. In another aspect of the invention, the gap can be formed by employing a low K thin dielectric material between metal layers in a multi-metal MMIC process.

The 3D quad-push VCO is capable of realizing substantially high-frequency operations (i.e., 200 GHz band), and can extend the output operation frequency well beyond the cut-off frequency ($f_T$) of the active devices. The 3D quad-push VCO also offers better phase noise performance. The circuit and resonators tolerance can be satisfactorily achieved for high frequency applications using MMIC processing. Also, resonators, VCO cores, and the phasing ring can all be integrated on one chip. This improves the yields, performances and lowers down the overall cost.

Figure 2:
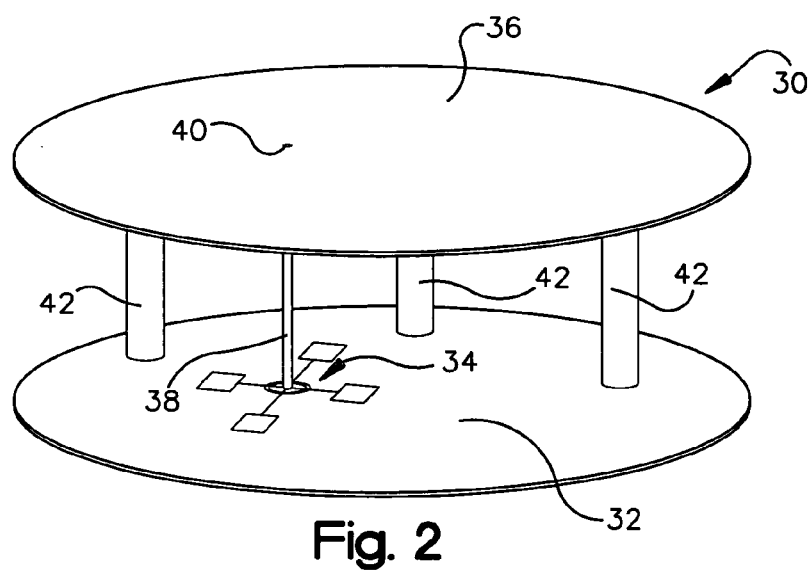
FIG. 2 illustrates a perspective view of a 3D quad-push MMIC VCO formed employing wafer level packaging (WLP) in accordance with an aspect of the present invention.

FIG. 2 illustrates a 3D quad-push VCO 30 formed employing wafer level packaging in accordance with an aspect of the present invention. Four frequency matched VCOs are coupled to a phasing ring providing a quad-push arrangement 34 fabricated on a first wafer 32. The four VCOs are operating in mutual injection mode oscillating at a same fundamental frequency with a phase difference of 90°, 180° and 270° from each other to provide $4_{th}$ harmonic multiples at a central output connection point of the phasing ring. The phasing ring has a circumference that is substantially equal to one waveguide wavelength. The dimensions of the phasing ring are selected such that the connection points are separated by a distance of ¼ waveguide wavelength from adjacent VCO connection points. A second wafer 36 is provided with an output tap 40 for providing an output for the quad-push VCO 30.

The first wafer 32 and the second wafer 36 are configured in a stacked arrangement separated by bonding posts 42 with an output conductor transition 38 having a first end coupled to the central output connection point of the phasing ring on the first wafer 32 and a second end provided as an output tap to the quad-push VCO 30 that extends substantially perpendicular or transverse to the first wafer 32 and ends at the output tap contact 40 of the second wafer 36, wherein the first wafer 32 and the second wafer 36 are separated by an air gap. It is to be appreciated that the employment of wafer level packaging can be employed to fabricate a variety of different 3D MMIC VCO types, such as an N-push/push-push VCO configuration. It is also to be appreciated that a different number of VCOs can be employed, such as two, six, eight or other even multiples with an equal number of connection points spaced equidistantly around the periphery of the phasing ring having a circumference equal to about 1 wavelength.

Figure 3:
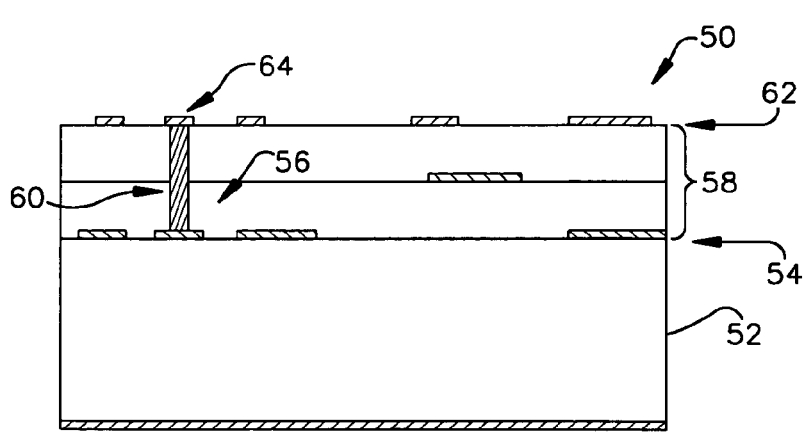
FIG. 3 illustrates a cross-sectional view of a 3D multi-push MMIC VCO formed employing a multi-metal process in accordance with an aspect of the present invention.

FIG. 3 illustrates a 3D MMIC VCO 50 fabricated with a multi-metal process in accordance with an aspect of the present invention. A first metal layer 54 is formed over a semiconductor substrate 52 (e.g., Indium Phosphide, Gallium Arsenide, Gallium Nitride, Silicon, Silicon Germanium). In the first metal layer 54, a plurality of VCOs are formed from resonators and respective VCO cores can be fabricated coupled to a phasing ring having respective VCO connection points spaced equidistantly around the periphery of the phasing ring having a circumference substantially equal to one waveguide wavelength. The phasing ring can have a central output connection point for providing a VCO output signal. The plurality of VCOs and phasing ring form a multi-push VCO 56.

One or more dielectric layers 58 can be formed over the first metal layer 54. The one or more dielectric layers 58 can have intervening metal layers. A via can be etch through the one or more dielectric layers 58. The via can be filled with a conductive MMIC material to form an output conductor transition 60 from the central output connection point of the phasing ring to a top surface of the one or more dielectric layers 58. A subsequent metal layer 62 can be formed over the one or more dielectric layers 58, and an output tap 64 etched to form a contact to the output conductor transition 60.

Figure 4:
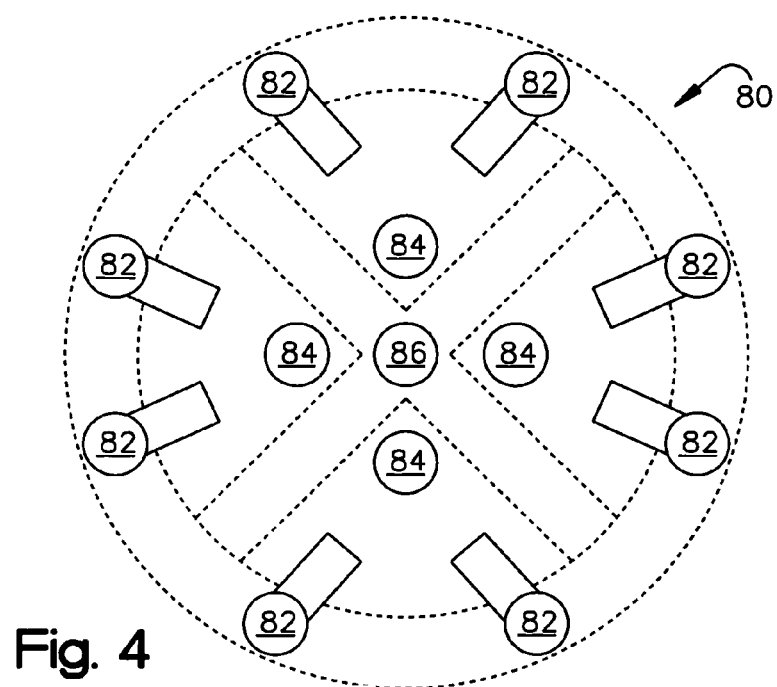
FIG. 4 illustrates a plan view of a phasing ring in accordance with an aspect of the present invention

FIG. 4 illustrates a plan view of a phasing ring 80 in accordance with an aspect of the present invention. The phasing ring 80 is similar to the phasing ring 20 of FIG. 1 but includes a plurality of loading stubs 82 that are spaced apart along the periphery of the phasing ring 80 and a plurality of conductors 84 spaced apart around a central output connection point 86 of the phasing ring 80. The loading stubs 82 extend from a first plane associated with the phasing ring and a plurality of VCOs to the second plane that provides the output tap of a multi-push VCO associated with the phasing ring 80. The loading stubs 82 provide additional capacitance to the phasing ring 80 allowing for the size of the phasing ring 80 to be smaller (i.e., less than a single waveguide wavelength) than the phasing ring 20 of FIG. 1. The plurality of conductors 84 extend from a first plane associated with the phasing ring and the plurality of VCOs to the second plane that provides the output tap of the quad-push VCO to provide an isolation shield to isolate the output conductor transition to be shielded from radio frequency and electromagnetic interference associated with other signals, and to further isolate other signals from the multi-push VCO output, such as functioning similarly to a coaxial shield.

Figure 5:
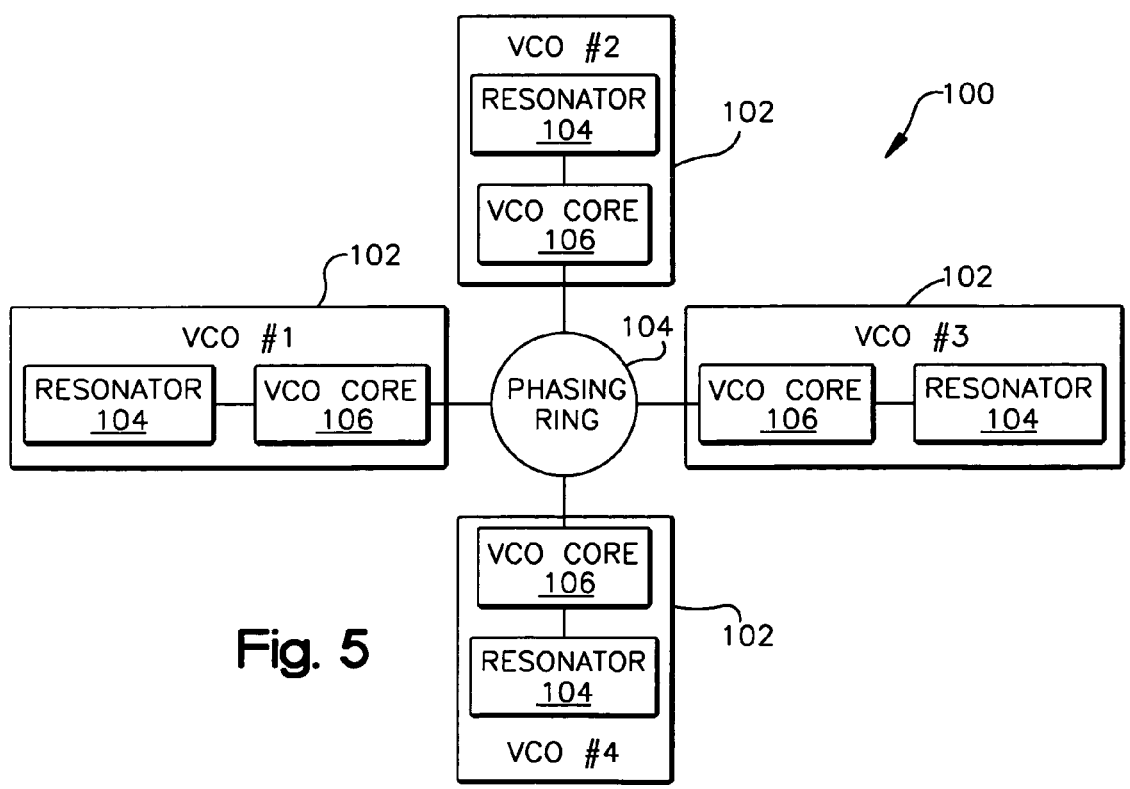
FIG. 5 illustrates a block diagram of a 3D quad-push MMIC VCO in accordance with an aspect of the present invention.

FIG. 5 illustrates a block diagram of a quad-push VCO 100 employing 3D cavity resonators in accordance with an aspect of the present invention. The quad-push VCO 100 includes four VCOs 102 coupled to a phasing ring 104 at four connecting points disposed ¼ waveguide wavelength from adjacent VCO connection points, such that the respective input signals from each VCO are provided at 90° out of phase with a respective adjacent input signal. Each VCO 102 is formed of a 3D cavity resonator 104 and a VCO core 106. The VCO core 106 can be fabricated with circuitry based on known techniques. The cavity resonator 104 provides an energy tank (e.g., electrical energy, magnetic energy) to facilitate oscillation of the VCO 102. The VCOs 102 and the phasing ring 104 can be fabricated on a same first layer, while the center output conductor of the phasing ring 104 escapes the first layer by extending transversely or vertically to a second layer.

Figure 6:
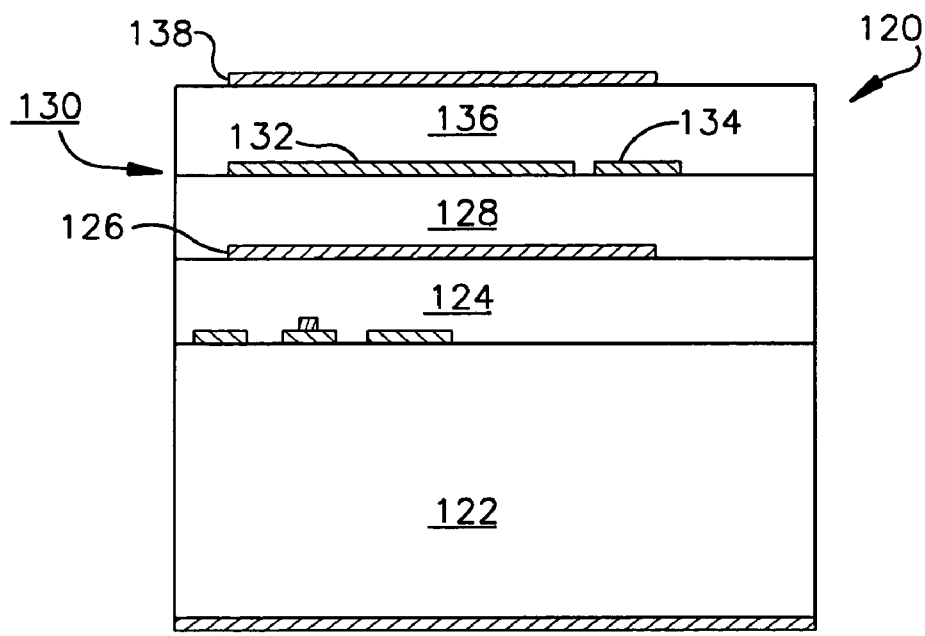
FIG. 6 illustrates a cross-sectional view of a 3D stripline resonator in accordance with an aspect of the present invention.

FIG. 6 illustrates a 3D MMIC stripline resonator 120 in accordance with an aspect of the present invention. The stripline resonator 120 provides a resonant tank for one of the VCOs of the plurality of VCOs associated with a 3D multi-push MMIC VCO as illustrated in FIGS. 1, 2 and 4. The stripline resonator 120 enhances the multi-push VCO performance by reducing phase noise and energy losses and providing a high quality (Q) factor. A first dielectric layer 124 is formed over a semiconductor substrate 122. The first dielectric layer 124 can have one or more intervening metal layers. A first ground plane 126 is formed over the first dielectric layer 124 by, for example, etching a metal layer. A second dielectric layer 128 is formed over the first ground plane 126. A stripline conductor 130 is formed over the second dielectric layer 124. The stripline conductor 130 includes a first conductive portion 132 separated from a second conductive portion 134 by a gap. The gap provides a capacitive coupling between the first conductive portion 132 and the second conductive portion 134. The second conductive portion 134 of the stripline conductor 130 can be coupled to a VCO core of a 3D multi-push VCO. A third dielectric layer 136 is formed over the stripline conductor 130. A second ground plane 138 is formed over the third dielectric layer 136, for example, by etching a metal layer. One or more subsequent dielectric layers and metal layers can be formed over second ground plane 138.

The stripline conductor 130 is disposed between the first ground plane 126 and the second ground plane 138 providing an energy tank to facilitate oscillation of one of a plurality of VCOs associated with the 3D multi-push VCO. The 3D multi-push VCO can include a plurality of VCOs coupled to a phasing ring on a given layer. The given layer can be on the same layer as the stripline conductor or different layer as the stripline conductor via a vertical conductor transition. The stripline resonator 120 can be employed with a multilevel process and/or a wafer level packaging process.

Figure 7:
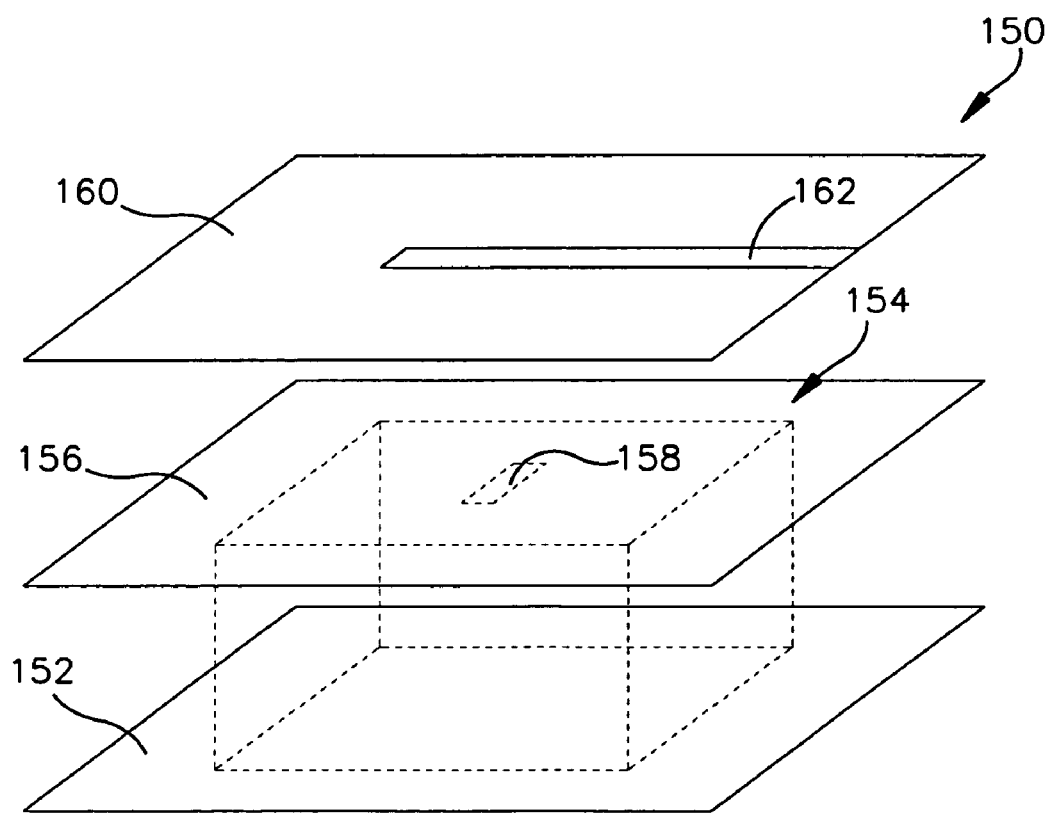
FIG. 7 illustrates a perspective view of a 3D cavity resonator in accordance with an aspect of the present invention.

FIG. 7 illustrates a 3D MMIC cavity resonator 150 in accordance with an aspect of the present invention. The cavity resonator 150 provides a resonant tank for one of the VCOs of the plurality of VCOs associated with a 3D multi-push VCO as illustrated in FIGS. 1, 2 and 4. The cavity resonator 150 also enhances the multi-push VCO performance by reducing phase noise and energy losses and providing a high quality (Q) factor. A closed cavity 154 is formed between a first metal layer 152 and a second metal layer 156. Between the first and second metal layers 152 and 156, a dielectric layer can be formed of low-k dielectric polymer, such as Benzocyclobutene (BCB). In addition to good planarization, the BCB layers also serve to electrically isolate the devices and protect the bonded structures during subsequent processing.

The first metal layer 152 can be formed over a semiconductor substrate, or another dielectric layer. The closed cavity 154 is formed of a metal cavity. The metal cavity can be formed by building a metal floor portion, a metal top portion and metal side portions via MMIC deposition techniques. The first metal layer 152 can be employed as the metal floor portion and the second metal layer can form the metal top portion. A coupling slot 158 is then etched in the metal top portion or second metal layer 156 to complete the closed cavity 154. The cavity can be filled with air or a dielectric material, such as described above. A metal layer 160 is formed over the closed cavity 154 with a conductive line 162 that extends from the coupling slot 158 to a VCO core of a 3D multi-push VCO. One or more subsequent dielectric layers and metal layers can be formed over conductive line.

The cavity resonator 150 provides an energy tank to facilitate oscillation of one of a plurality of VCOs associated with a 3D multi-push VCO. The 3D multi-push VCO can include a plurality of VCOs coupled to a phasing ring on a given layer. The given layer can be on the same layer as the conductive line or a different layer as the conductive line via a vertical conductor transition. The cavity resonator 150 can be employed with a multilevel process and/or a wafer level packaging process. A high Q 3-D cavity resonator can be implemented monolithically, and the VCO, resonator, phasing ring, or even planar antennas can be integrated in one single chip.

Figure 8:
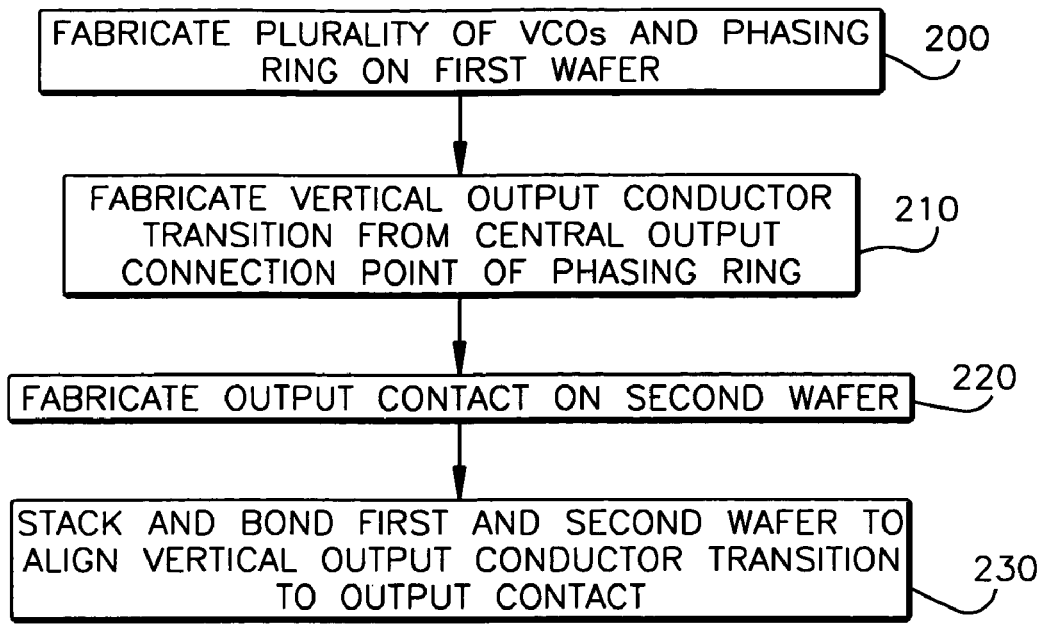
FIG. 8 illustrates a methodology for forming a 3D MMIC multi-push VCO employing wafer level packaging in accordance with an aspect of the present invention.
Figure 9:
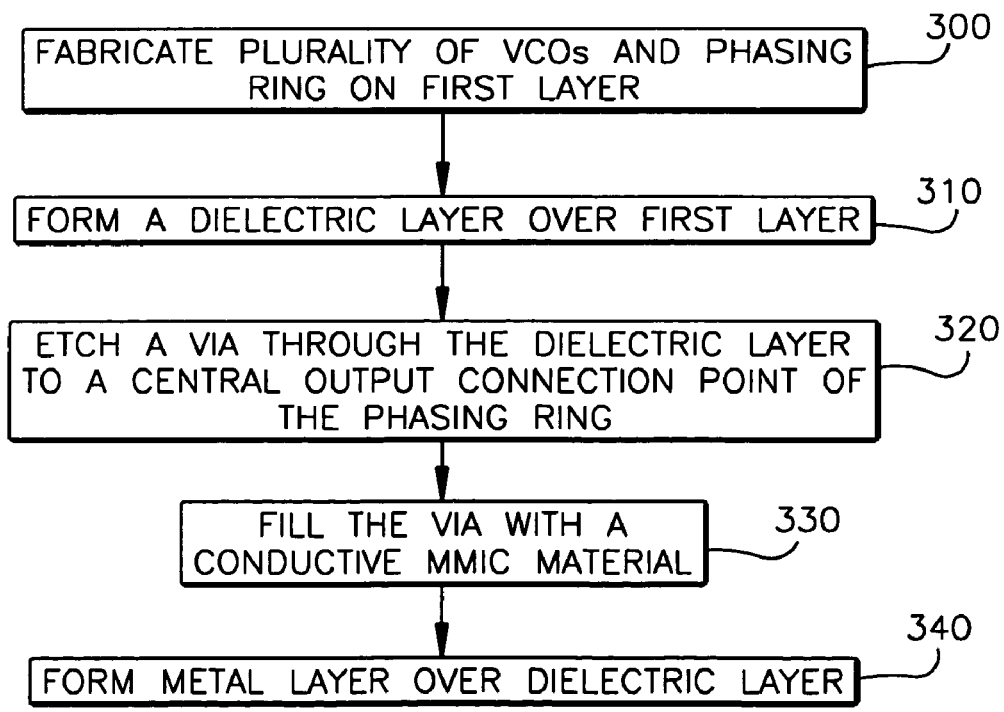
FIG. 9 illustrates a methodology for forming a 3D MMIC multi-push VCO employing a multi-metal process in accordance with an aspect of the present invention.

In view of the foregoing structural and functional features described above, a methodology in accordance with various aspects of the present invention will be better appreciated with reference to FIGS. 8-9. While, for purposes of simplicity of explanation, the methodologies of FIGS. 8-9 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 8 illustrates a methodology for forming a 3D MMIC multi-push VCO employing wafer level packaging in accordance with an aspect of the present invention. At 200, a plurality of VCOs are fabricated along with a phasing ring on a first wafer. The plurality of VCOs can be formed from 3D resonators and respective VCOs coupled to a phasing ring having respective VCO connection points spaced equidistantly around the periphery of the phasing ring with a circumference substantially equal to one waveguide wavelength. The 3D resonator can be a stripline resonator as illustrated in FIG. 6 or a cavity resonator as illustrated in FIG. 7. The phasing ring can have a central output connection point for providing a VCO output signal. The plurality of VCOs and phasing ring form a multi-push VCO. In one aspect of the invention, the multi-push VCO is a quad-push VCO with four VCOs coupled to four VCO connection points. Each VCO connection point is spaced apart from adjacent VCO connection points by ¼ waveguide wavelength, such that the phasing ring provides $4^{th}$ harmonic multiples at the central output connection point of the VCO while canceling out the fundamental frequencies, the $1^{st}$, $2^{nd}$ and $3^{rd}$ harmonic multiples. The methodology then proceeds to 210.

At 210, an output conductor transition is fabricated that is coupled to the center output point of the phasing ring and extends substantially transversely, vertically or perpendicular to the first wafer. At 220, a second wafer is fabricated with an output contact that provides an output tap contact for the 3D multi-push VCO. The second wafer can include a plurality of additional active and/or passive components coupled to the 3D MMIC multi-push VCO based on the particular implementation. At 230, the first wafer is bonded to the second wafer via bonding posts to align the output conductor transition to the output tap contact of the second wafer.

FIG. 9 illustrates a methodology for forming a MMIC multi-push VCO employing a multi-metal process in accordance with an aspect of the present invention. At 300, a plurality of VCOs are fabricated along with a phasing ring on a first layer. The plurality of VCOs can be formed from 3D resonators and respective VCOs coupled to a phasing ring having respective VCO connection points spaced substantially equidistantly around the periphery of the phasing ring with a circumference substantially equal to one waveguide wavelength. The 3D resonator can be a stripline resonator as illustrated in FIG. 6 or a cavity resonator as illustrated in FIG. 7. The phasing ring can have a central output connection point for providing a VCO output signal. The plurality of VCOs and phasing ring form a multi-push VCO. The multi-push VCO can be a quad-push VCO with four VCOs coupled to four VCO connection points spaced apart from adjacent VCO connection points by ¼ waveguide wavelength, such as previously described. The methodology then proceeds to 310.

At 310, a dielectric layer is formed over the plurality of VCOs and the phasing ring. At 320, a via is etched through the dielectric layer to a central output connection point of the phasing ring. At 330, the via is filled with a conductive MMIC metal (e.g., gold) to form an output conductor transition from the central output connection point of the phasing ring that extends substantially transverse, vertical or perpendicular from the phasing ring. At 340, a metal layer is formed over the dielectric layer and an output contact is formed coupled to the output conductor transition. A plurality of additional active and/or passive components coupled to the 3D MMIC multi-push VCO can be formed on the second layer or additional layers based on the particular implementation.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A three dimensional (3D) microwave monolithic integrated circuit (MMIC) multi-push voltage controlled oscillator (VCO), comprising:

a phasing ring having a plurality of substantially equidistantly spaced apart VCO connection points and a central output connection point, the central output connection point residing in a first plane;

a plurality of VCOs, each of the plurality of VCOs being coupled to one associated VCO connection point; and an output conductor transition that extends from the central output connection point and terminates at an output tap located in a second plane that is spaced apart from the first plane.

2. The multi-push VCO of claim 1, wherein the phasing ring has circumference that is substantially equal to one waveguide wavelength.

3. The multi-push VCO of claim 2, wherein the phasing ring has four VCO connection points that are spaced apart ¼ waveguide wavelength from adjacent VCO connection points and four frequency matched VCOs that are each coupled to an associated one of the four VCO connection points, the phasing ring provides an output signal at the central output connection point that is a fourth harmonic multiple of the fundamental frequency of the four VCOs.

4. The multi-push VCO of claim 1, further comprising loading stubs that extend around the periphery of the phasing ring.

5. The multi-push VCO of claim 1, further comprising a plurality of conductors spaced apart around the output conductor to form a transition and to isolate the output signal of the phasing ring from other signals, the plurality of conductors extending from the first plane to the second plane.

6. The multi-push VCO of claim 1, wherein the first plane is disposed along a first layer and the second plane is disposed along a second layer of a multi-metal stacked structure.

7. The multi-push VCO of claim 1, wherein the phasing ring and the plurality of VCOs reside on a first wafer and the output tap resides on a second wafer, the first and second wafer being configured in a stacked arrangement separated by a gap.

8. The multi-push VCO of claim 1, wherein each of the plurality of VCOs comprises a 3D resonator coupled to a VCO core.

9. The multi-push VCO of claim 8, wherein the 3D resonator comprises a first ground plane disposed in a first layer, a stripline conductor disposed in a second layer and a second ground plane disposed in a third layer, the stripline conductor being located spaced apart and between the first and second ground planes and being coupled to the VCO core.

10. The multi-push VCO of claim 8, wherein the 3D resonator comprises a metal closed cavity having a coupling slot on a top portion disposed between two dielectric layers and a conductive line that extends between the coupling slot and the VCO core.

11. A three dimensional (3D) microwave monolithic integrated circuit (MMIC) quad-push voltage controlled oscillator (VCO), comprising:
a phasing ring having four substantially equidistantly spaced apart VCO connection points and a central output connection point, the central output connection point residing in a first layer;
four frequency matching VCOs, each of the four frequency matching VCOs being coupled to one associated VCO connection point; and
an output conductor transition that extends from the central output connection point and terminates at an output tap located in a second layer that is spaced apart from the first layer.

12. The quad-push VCO of claim 11, wherein the phasing ring has circumference that is substantially equal to one waveguide wavelength with the four VCO connection points being spaced apart ¼ waveguide wavelength from adjacent VCO connection points, wherein the phasing ring provides an output signal at the central output connection point that is a fourth harmonic multiple of the fundamental frequency of the four frequency matching VCOs.

13. The quad-push VCO of claim 11, further comprising loading stubs that extend around the periphery of the phasing ring.

14. The quad-push VCO of claim 11, further comprising a plurality of conductors spaced apart around the output conductor to form a transition and to isolate the output signal of the phasing ring from other signals, the plurality of conductors extending from the first plane to the second plane.

15. The quad-push VCO of claim 11, wherein the first layer resides in a first wafer and the second layer resides on a second wafer, the first and second wafer being configured in a stacked arrangement separated by a gap via bonding posts.

16. The quad-push VCO of claim 11, wherein each of the plurality of VCOs comprises a 3D resonator coupled to a VCO core, the 3D resonator being one of a 3D stripline resonator and a 3D cavity resonator.

17. A method of forming a three dimensional (3D) microwave monolithic integrated circuit (MMIC) multi-push voltage controlled oscillator (VCO), the method comprising:
forming in a first layer a phasing ring having a plurality of substantially equidistantly spaced apart VCO connection points and a central connection output point and a plurality of frequency matched VCOs each with outputs coupled to one associated VCO connection point;
forming an output conductor transition having a first end coupled to the central output connection point, the output conductor transition extending transverse from the first layer; and
forming an output tap at the second layer, the output tap being coupled to a second end of the output conductor transition.

18. The method of claim 17, wherein the phasing ring is formed to have a circumference that is substantially equal to one waveguide wavelength, and the four VCO connection points are spaced apart ¼ waveguide wavelength from adjacent VCO connection points with a VCO coupled to each associated VCO connection points, the phasing ring provides an output signal at the central output connection point that is a fourth harmonic multiple of the fundamental frequency of the plurality of frequency matched VCOs.

19. The method of claim 17, wherein the 3D MMIC VCO is formed employing a multi-metal process.

20. The method of claim 17, wherein the first layer is formed on a first wafer and the second layer is formed on a second wafer, and further comprising stacking the first wafer and the second wafer to align the output tap of the second wafer with the central output connection point of the first wafer with the output conductor transition extending between the first and second wafer.

21. The method of claim 17, further comprising fabricating a stripline resonator for at least one of the plurality of frequency matched VCOs, the fabricating comprising:
forming a first ground plane;
forming a stripline conductor; and
forming a second ground plane, the stripline conductor being located spaced apart and between the first and second ground planes; and
forming a VCO core coupled to an output of the stripline conductor.

22. The method of claim 17, further comprising fabricating a 3D cavity resonator for at least one of the plurality of frequency matched VCOs, the fabricating comprising:
  forming a first dielectric layer;
  forming a metal cavity over the first dielectric layer;
  forming a second dielectric layer over the metal cavity;
  etching a coupling slot through the second dielectric layer and a top portion of the metal cavity; and
  forming a conductive line with a first end connected to the coupling slot and a second end coupled to a VCO core.

23. The method of claim 22, wherein the first dielectric layer and the second dielectric layer are formed from Benzocyclobutene (BCB).

\* \* \* \* \*